United States Patent
Liu

(10) Patent No.: US 12,100,657 B2
(45) Date of Patent: Sep. 24, 2024

(54) SEMICONDUCTOR DEVICE AND METHOD FOR FORMING SEMICONDUCTOR DEVICE

(71) Applicant: CHANGXIN MEMORY TECHNOLOGIES, INC., Hefei (CN)

(72) Inventor: Zhongming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 423 days.

(21) Appl. No.: 17/411,127

(22) Filed: Aug. 25, 2021

(65) Prior Publication Data
US 2022/0051977 A1 Feb. 17, 2022

Related U.S. Application Data

(63) Continuation of application No. PCT/CN2021/099989, filed on Jun. 15, 2021.

(30) Foreign Application Priority Data

Aug. 12, 2020 (CN) .......................... 202010805989.9

(51) Int. Cl.
*H01L 23/528* (2006.01)
*H01L 21/311* (2006.01)
*H01L 21/3213* (2006.01)
*H01L 21/768* (2006.01)
*G11C 5/06* (2006.01)

(52) U.S. Cl.
CPC .... *H01L 23/5283* (2013.01); *H01L 21/31144* (2013.01); *H01L 21/32139* (2013.01); *H01L 21/76805* (2013.01); *H01L 21/76816* (2013.01); *G11C 5/063* (2013.01)

(58) Field of Classification Search
CPC ................................................ H01L 21/76816
See application file for complete search history.

(56) References Cited

U.S. PATENT DOCUMENTS

| | | |
|---|---|---|
| 9,206,030 B2 | 12/2015 | Hong |
| 9,738,508 B2 | 8/2017 | Hong |
| 10,083,982 B2 | 9/2018 | Shigemura et al. |
| 10,535,669 B2 | 1/2020 | Wang et al. |
| 10,770,468 B2 | 9/2020 | Wang et al. |
| 2015/0008543 A1 | 1/2015 | Hong |

(Continued)

FOREIGN PATENT DOCUMENTS

| CN | 104280161 A | 1/2015 |
|---|---|---|
| CN | 110100307 A | 8/2019 |

*Primary Examiner* — Yu-Hsi D Sun
(74) *Attorney, Agent, or Firm* — Kilpatrick Townsend & Stockton LLP

(57) ABSTRACT

A semiconductor device and a method for forming a semiconductor device are provided. The method for forming a semiconductor device includes the following steps. A substrate is provided, in which the substrate has a periphery region, a jointing region and a device region adjoined in sequence. A metal layer is formed on an upper surface of the substrate. A dielectric layer is formed above the metal layer. An opening is formed in the dielectric layer, in which the opening is located above at least one of the periphery region or the jointing region so as to expose the metal layer to form a contact window, and a height of an upper surface of the metal layer exposed to the contact window is lower than a height of an upper surface of the metal layer located in the device region.

14 Claims, 6 Drawing Sheets

(56) References Cited

U.S. PATENT DOCUMENTS

| | | |
|---|---|---|
| 2016/0152465 A1 | 6/2016 | Hong |
| 2018/0138194 A1 | 5/2018 | Shigemura et al. |
| 2018/0286870 A1* | 10/2018 | Kim ..................... H01L 21/71 |
| 2019/0157280 A1 | 5/2019 | Wang et al. |
| 2020/0126999 A1 | 4/2020 | Wang et al. |

* cited by examiner

SEMICONDUCTOR DEVICE AND METHOD FOR FORMING SEMICONDUCTOR DEVICE

CROSS-REFERENCE TO RELATED APPLICATIONS

This is a continuation application of International Patent Application No. PCT/CN2021/099989, filed on Jun. 15, 2021, which claims priority to Chinese patent application No. 202010805989.9, filed on Aug. 12, 2020, and entitled "Semiconductor Device and Method for Forming Semiconductor Device". The disclosures of International Patent Application No. PCT/CN2021/099989 and Chinese patent application No. 202010805989.9 are incorporated by reference herein in their entireties.

TECHNICAL FIELD

This disclosure relates to the field of semiconductor preparation, and in particular to a semiconductor device and a method for forming a semiconductor device.

BACKGROUND

In the related art, when a memory is prepared, a contact window will be formed within a region, close to a device region, of a periphery region of the memory and is configured to expose conductive metal in the memory so as to form a peripheral contact landing pad iso-electrically connected with bit lines. Along with gradual reducing of a critical dimension of the memory, a distance between the two adjacent bit lines is gradually reduced as well. Before forming a bit line structure, a mask structure needs to be formed firstly on an upper surface of a metal layer for forming the bit line structure, and a trench with a high depth-to-width ratio is formed downwards from an upper surface of the mask structure in a direction perpendicular to the upper surface of the mask structure, so as to form the required bit line structure with the small critical dimension.

In the related art, when the contact window is formed and the peripheral contact landing pad is prepared, there are often the problem that the peripheral contact landing pad is poor in form and poor in conductivity, thereby influencing a preparation yield of the memory.

SUMMARY

According to a first aspect of the disclosure, a method for forming a semiconductor is provided and includes the following steps. A substrate is provided, in which the substrate has a periphery region, a jointing region and a device region adjoined in sequence. A metal layer is formed on an upper surface of the substrate. A dielectric layer is formed above the metal layer. An opening is formed in the dielectric layer, in which the opening is located above at least one of the periphery region or the jointing region so as to expose the metal layer to form a contact window, and a height of an upper surface of the metal layer exposed to the contact window is lower than a height of an upper surface of the metal layer located in the device region.

According to a second aspect of the disclosure, a semiconductor device is further provided and includes: a substrate formed with a periphery region, a device region and a jointing region; a metal layer, formed above the substrate; and a dielectric layer, formed above the metal layer, in which a contact window is formed on a surface of the dielectric layer so as to expose the metal layer, and a height of an upper surface of the metal layer exposed to the contact window is lower than a height of an upper surface of the metal layer located in the device region.

DETAILED DESCRIPTION

Figure 1:
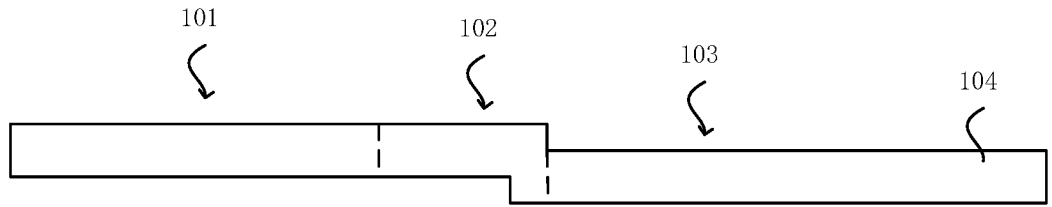
FIG. 1 is a schematic diagram of a form structure of a metal layer, configured to prepare a bit line structure, of a memory in the related art.
Figure 2:
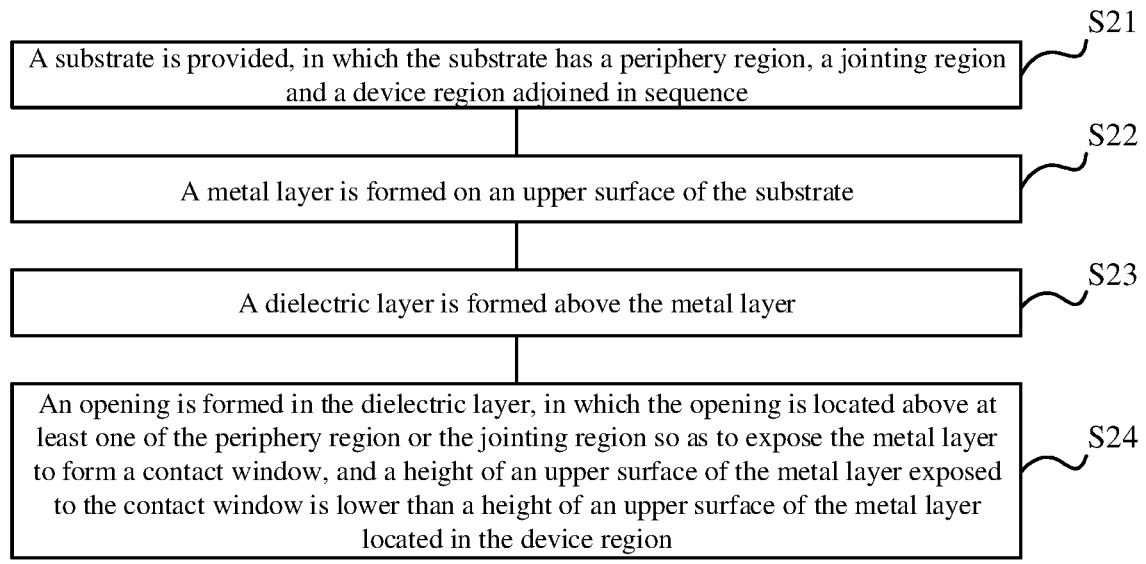
FIG. 2 is a schematic diagram of a step process of a preparation method in some embodiments according to this disclosure.
Figure 3:
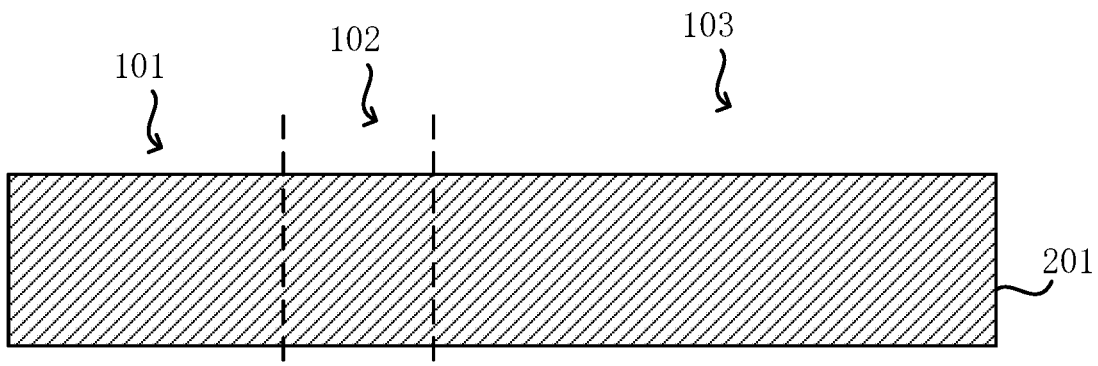
FIGS. 3-9 are schematic structural diagrams of a semiconductor device corresponding to steps of a preparation method in some embodiments according to this disclosure.

A study found that the poor form and poor conductivity of a peripheral contact landing pad lie in that, in the related art, a height of an upper surface of a metal layer at a position where a contact window is expected to be formed is higher than a height of an upper surface of a metal layer located in a device region, the whole metal layer is distributed in a Z shape from a periphery region to the device region, and the metal layer located in the periphery region is integrally higher than the metal layer located in the device region. Referring to FIG. 1 here, a jointing region 102 is further formed between the device region 103 and the periphery region 101, the contact window is located within the jointing region 102, and a height of the metal layer 104 in the jointing region 102 and the periphery region 101 is higher than a height of the metal layer 104 in the device region 103.

In this case, when the metal layer is etched based on a trench with a high depth-to-width ratio and a bit line structure is formed, etching gas will firstly come into contact with the metal layer located in a preset contact window position to etch it, and then come into contact with the metal layer located in the device region to etch the metal layer belonging to the device region. This results that when the bit line structure is formed, the etching gas will firstly come into contact with the metal layer located in the preset contact window position to etch it, and then come into contact with the metal layer located in the device region to etch the metal layer belonging to the device region. In this way, the metal layer located in the preset contact window position firstly contacts with the etching gas, thus its morphology is etched more compared with the metal layer located in the device region, so that the metal layer located in the preset contact window position is prone to being subjected to a necking phenomenon (Necking) and even being broken, thereby influencing the conductivity of the finally-formed peripheral contact landing pad.

This disclosure provides a semiconductor device and a method for forming a semiconductor device, which can solve the problem that a peripheral contact landing pad is poor in form and poor in conductivity, and improve the preparation yield of a memory.

A semiconductor device and a method for forming a semiconductor device are further explained and elaborated below with reference to figures.

Please refer to FIGS. 2-9, FIG. 2 is a schematic diagram of a step process of a preparation method in some embodiments according to this disclosure, and FIGS. 3-9 are schematic structural diagrams of a semiconductor device corresponding to steps of a preparation method in some embodiments according to this disclosure.

In the some embodiments, a method for forming a semiconductor device is provided, and includes the following steps. S21, a substrate 201 is provided, in which the substrate 201 has a periphery region 101, a jointing region 102 and a device region 103 adjoined in sequence, please refer to FIG. 3 here. S22, a metal layer 104 is formed on an upper surface of the substrate 201, please refer to FIG. 7 here. S23, a dielectric layer 204 is formed above the metal layer 104, please refer to FIG. 8 here. S24, an opening is formed in the dielectric layer 204, please refer to FIG. 9 here, in which the opening is located above at least one of the periphery region 101 or the jointing region 102 so as to expose the metal layer 104 to form a contact window 205, and a height of an upper surface of the metal layer 104 exposed to the contact window 205 is lower than a height of an upper surface of the metal layer 104 located in the device region 103.

In the some embodiments, the fact that the height of the upper surface of the metal layer 104 exposed to the contact window 205 is lower than the height of the upper surface of the metal layer 104 located in the device region 103 can effectively prevent etching gas from coming into contact with the upper surface of the metal layer 104 located in a contact window 205 region firstly when the metal layer 104 is etched, and avoid influencing on the conductivity of a peripheral contact landing pad formed on the basis of the contact window 205.

In some embodiments, forming the metal layer 104 includes the following steps. A first insulating layer 202 is formed on the upper surface of the substrate 201. The first insulating layer 202 is partially removed so as to form a step-shaped first insulating layer 202, and a height of an upper surface of the first insulating layer 202 located in the periphery region 101 is lower than a height of an upper surface of the first insulating layer 202 located in the device region 103. A step-shaped metal layer 104 is formed on the upper surface of the first insulating layer 202, and a height of an upper surface of the metal layer 104 located in the periphery region 101 is lower than the height of the upper surface of the metal layer 104 located in the device region 103.

In the some embodiments, when the metal layer 104 with the uniform thickness is formed, it may be ensured that the height of the upper surface of the metal layer 104 located in the contact window 205 is lower than the height of the upper surface of the metal layer 104 located in the device region 103, and the step is also consistent with the step process for preparing a memory. When the preparation method is applied to preparation of the memory, the step may correspond to the step of periphery nitride remove.

In some embodiments, the first insulating layer 202 includes a nitride layer. In the procedure of preparing the memory, a silicon nitride layer needs to be formed below the metal layer 104 and may serve as the first insulating layer 202.

Figure 4:
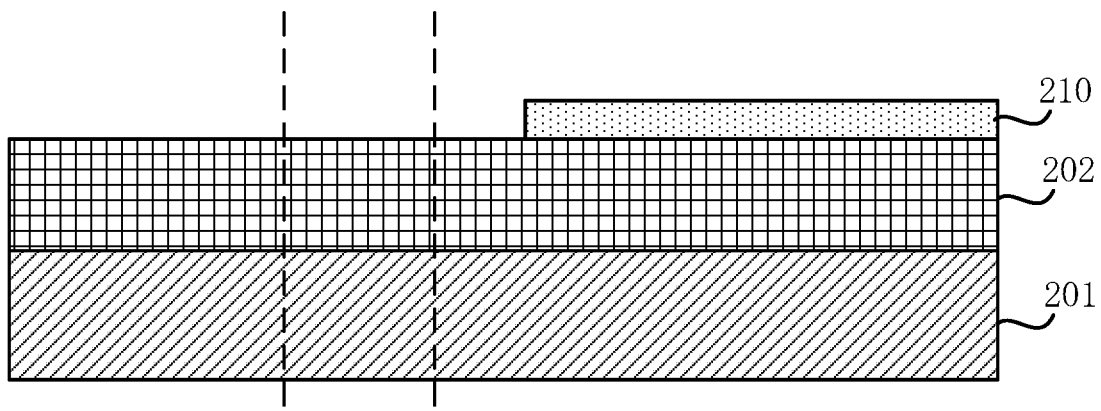
Figure 5:
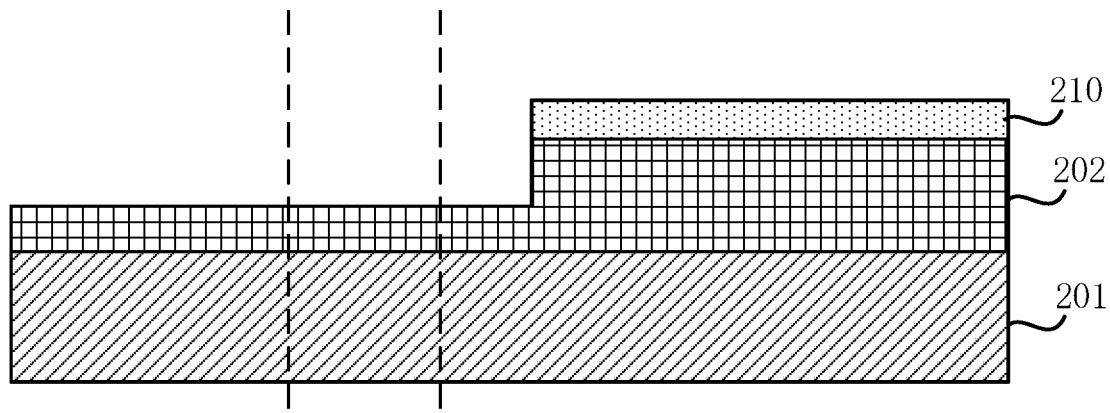
Figure 6:
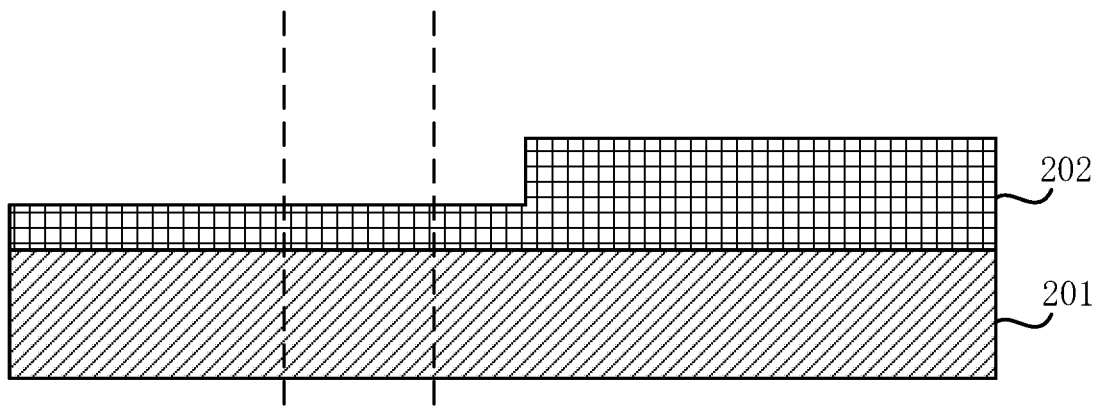
Figure 7:
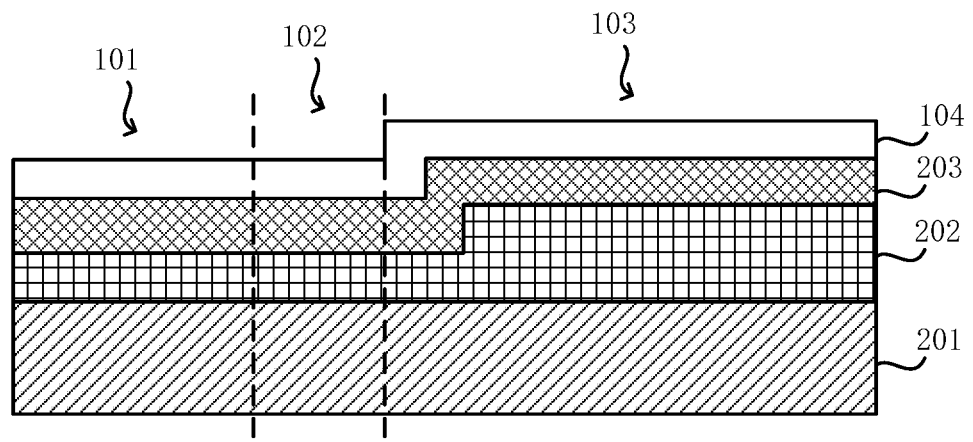
Figure 8:
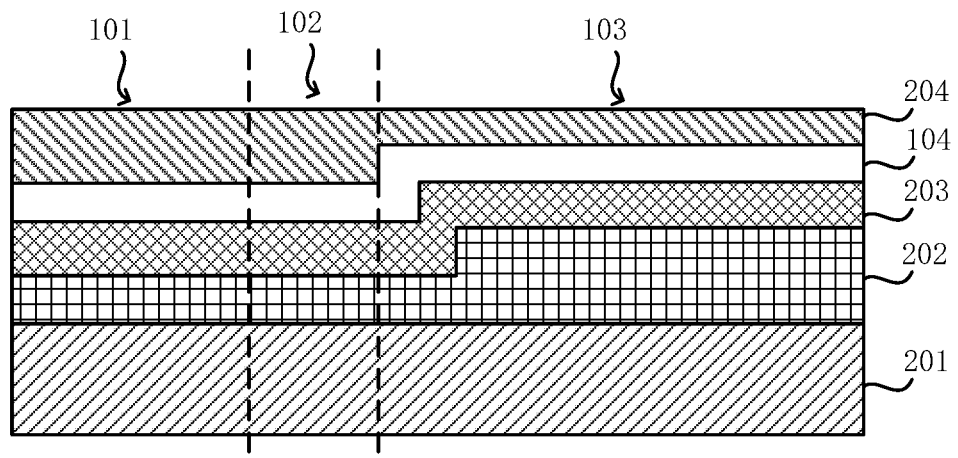
Figure 9:
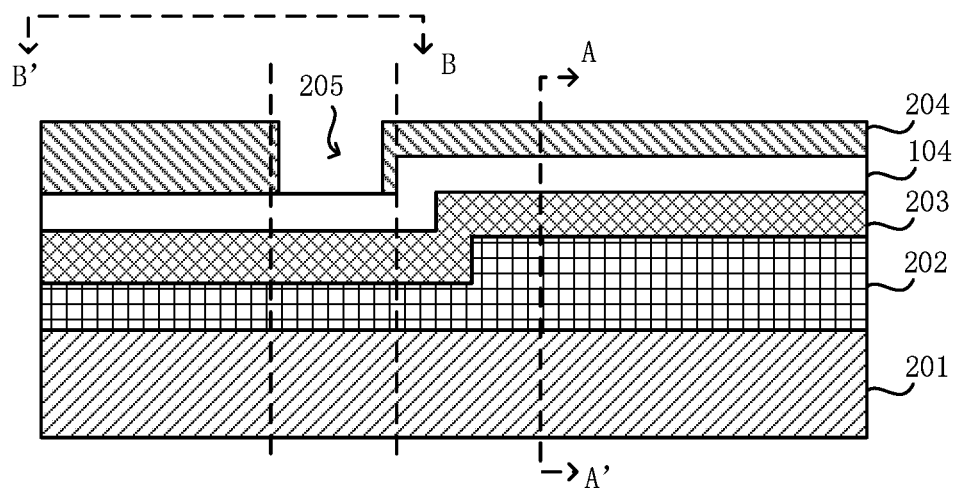
Figure 10:
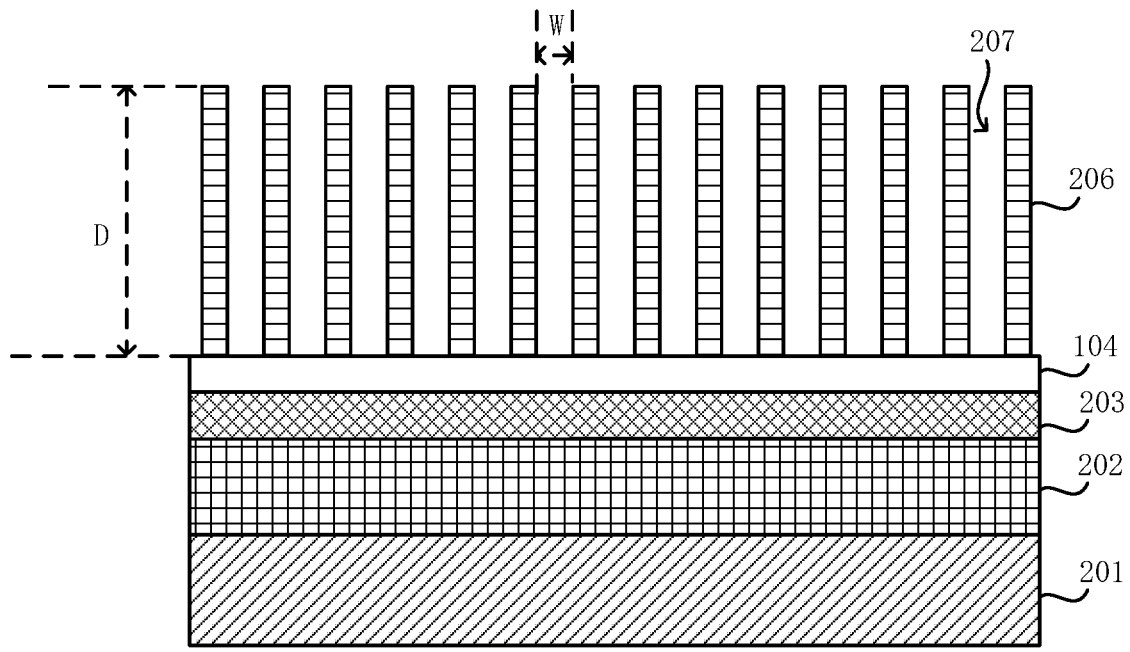
FIGS. 10-13 are schematic structural diagrams of a semiconductor device corresponding to steps of a preparation method when a bit line structure is prepared.
Figure 11:
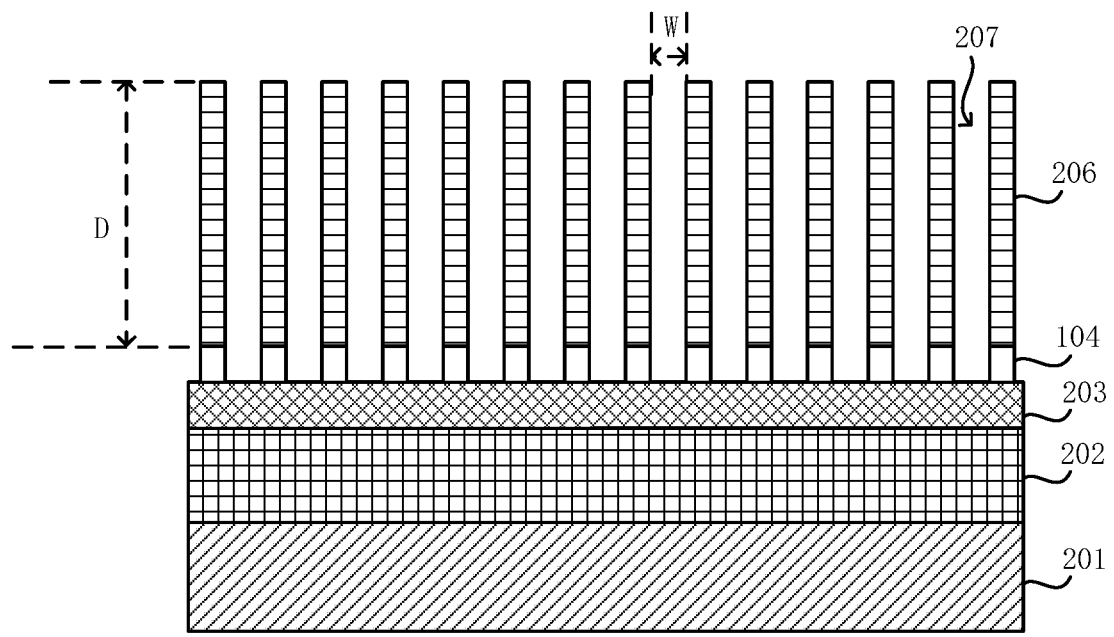
Figure 12:
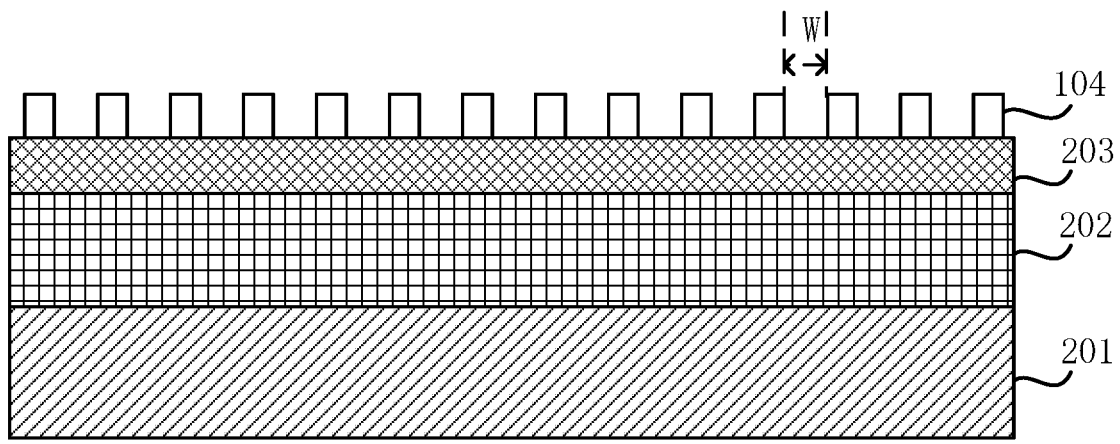

Please refer to FIGS. 4-6, in some embodiments, partially removing the first insulating layer 202 includes the following steps. A patterned first mask layer 210 is formed on the upper surface of the first insulating layer 202, in which the periphery region 101 and a part of the jointing region 102 are exposed from the first mask layer 210, and the first mask layer 210 covers the device region 103 and the remaining jointing region 102, please refer to FIG. 4. The first insulating layer 202 is partially removed using the first mask layer 210 as a mask, please refer to FIG. 5. The first mask layer 210 is removed, please refer to FIG. 6.

In this way, when the first insulating layer 202 is partially removed on the basis of the first mask layer 210, the periphery region 101 and the part of the jointing region 102 exposed from the first mask layer 210 may be partially removed. In some embodiments, a region exposed out of the first mask layer 210 is completely etched until the surface of the substrate 201 is exposed. In some other some embodiments, the region exposed out of the first mask layer 210 is only etched to a certain depth without penetrating through the first insulating layer 202.

In some embodiments, when the first insulating layer 202 is partially removed, an etching depth of the first insulating layer 202 may be set according to the needs. If it is necessary to adopt the semiconductor device to prepare the memory, a removing depth when the first insulating layer 202 is partially removed is needed to be set according to a minimum thickness of the first insulating layer 202 needed by the memory.

In some embodiments, the first insulating layer 202 is partially removed by adopting at least one of dry etching or wet etching.

In the some embodiments as shown in FIGS. 4-6, the first insulating layer 202 after being partially removed is in a step shape. Later, if there are still other material layers growing on the upper surface of the first insulating layer 202, the other material layers growing on the upper surface of the first insulating layer 202 are also in a step shape under the situation of uniform thickness of the material layers. Even if the metal layer 104 is formed above the subsequently generated material layers, a step-shaped metal layer 104 may also be obtained so as to ensure that the height of the upper surface of the metal layer 104 exposed to the contact window 205 is lower than the height of the upper surface of the metal layer 104 located in the device region 103.

In some embodiments, the following steps are also included. A second insulating layer 203 is formed on the upper surface of the substrate 201. The second insulating layer 203 is partially removed so as to form a groove in a position corresponding to the contact window 205, and a bottom surface of the groove is also located in the second insulating layer 203. The metal layer 104 is formed on an upper surface of the second insulating layer 203, and the height of the upper surface of the metal layer 104 formed in the groove is lower than the height of the upper surface of the metal layer 104 in the device region 103.

When the preparation method is applied to preparation of the memory, the step may correspond to a forming procedure of a bit line contact plug in the bit line structure, namely, a step of patterning a polycrystalline silicon layer below the metal layer 104 in the bit line structure. In the some embodiments, there is no requirement on a form structure of the nitride layer below the polycrystalline silicon layer, but a form structure of the polycrystalline silicon layer is directly modified, so that the polycrystalline silicon layer is in a step shape. In this way, the metal layer 104 grown on an upper surface of the polycrystalline silicon layer is also in a step shape, and the upper surface of the metal layer 104 exposed to the contact window 205 is lower than the upper surface of the metal layer 104 located in the device region 103.

On the basis that the nitride layer serves as the first insulating layer 202, the polycrystalline silicon layer is further formed on the upper surface of the nitride layer, which is consistent with a preparation process of the memory. Therefore, in addition to patterning the nitride layer so as to change the height of the surface to which the metal layer 104 is formed, the polycrystalline silicon layer may further be patterned so as to change the height of the surface to which the metal layer 104 is formed.

In the some embodiments, the polycrystalline silicon layer serving as the second insulating layer 203 is patterned, and the groove is formed in a preset region, so that when the metal layer 104 is formed on the upper surface of the polycrystalline silicon layer, the height of the upper surface of the metal layer 104 in the groove is lower than the height of the upper surface of the metal layer 104 located outside the groove. In this way, by presetting the position of the groove, it may be limited that the height of the upper surface of the metal layer 104 exposed to the contact window 205 is lower than the height of the upper surface of the metal layer 104 located in the device region 103, and the corresponding effect can be achieved.

In some embodiments, partially removing the second insulating layer 203 includes the following steps. A patterned second mask layer 208 is formed on the upper surface of the second insulating layer 203, and a through hole 209 is formed in the second mask layer 208 in a position corresponding to the contact window 205, please refer to FIG. 14, the through hole 209 in FIG. 14 contains a position in which the contact window 205 is to be formed. The second insulating layer 203 is etched downwards from the through hole 209 in a direction perpendicular to the upper surface of the substrate 201 so as to form the groove in the surface of the second insulating layer 203, please refer to FIG. 15 here. The second mask layer 208 is removed. Herein, the position of the groove is limited by limiting an exposed region of the patterned second mask layer 208, please refer to FIG. 16 here.

Figure 15:
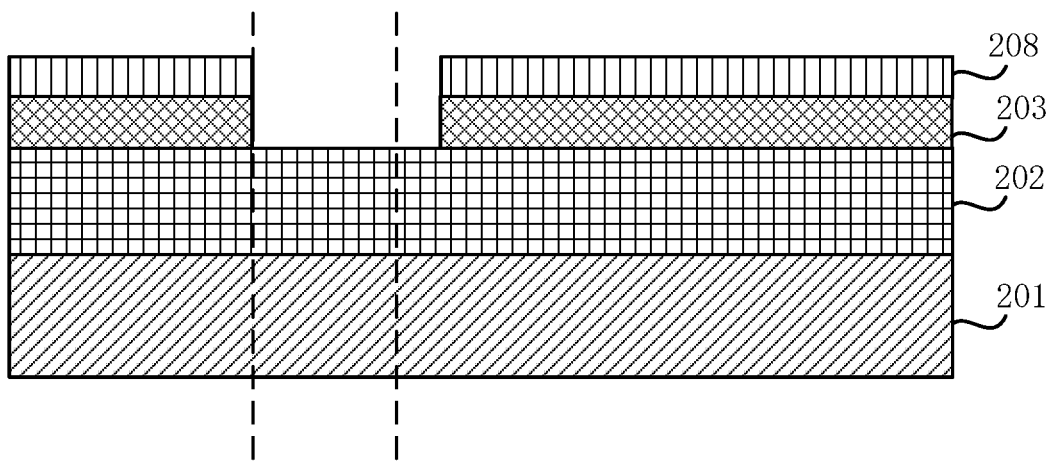

In the some embodiments as shown in FIG. 15, the groove penetrates through the second insulating layer 203. In practice, when the preparation method is applied to the preparation of the memory, the bottom surface of the groove should be located inside the second insulating layer 203, which is related to the minimum thickness of the second insulating layer 203 (namely, the polycrystalline silicon layer) required to form the memory.

Figure 14:
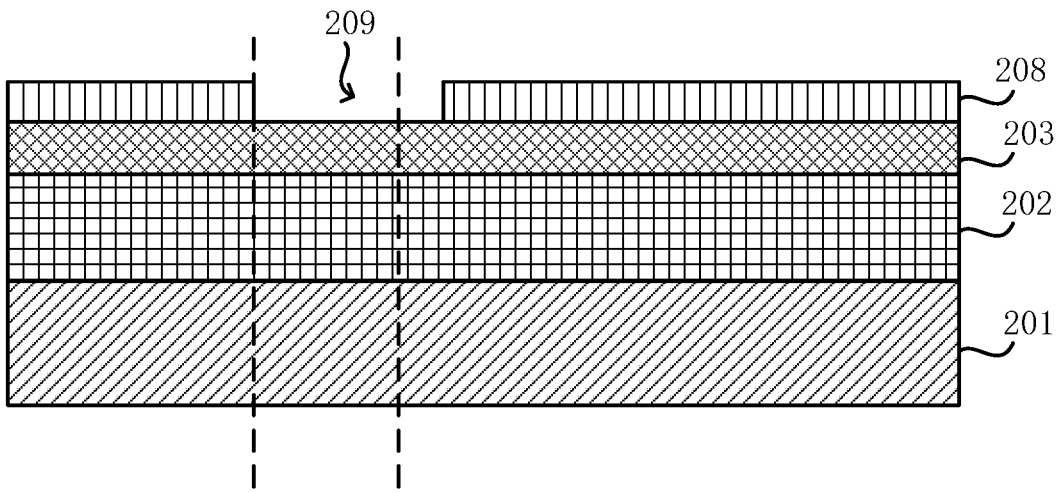
FIGS. 14-16 are schematic structural diagrams of a semiconductor device corresponding to steps when a second insulating layer is partially removed.
Figure 16:
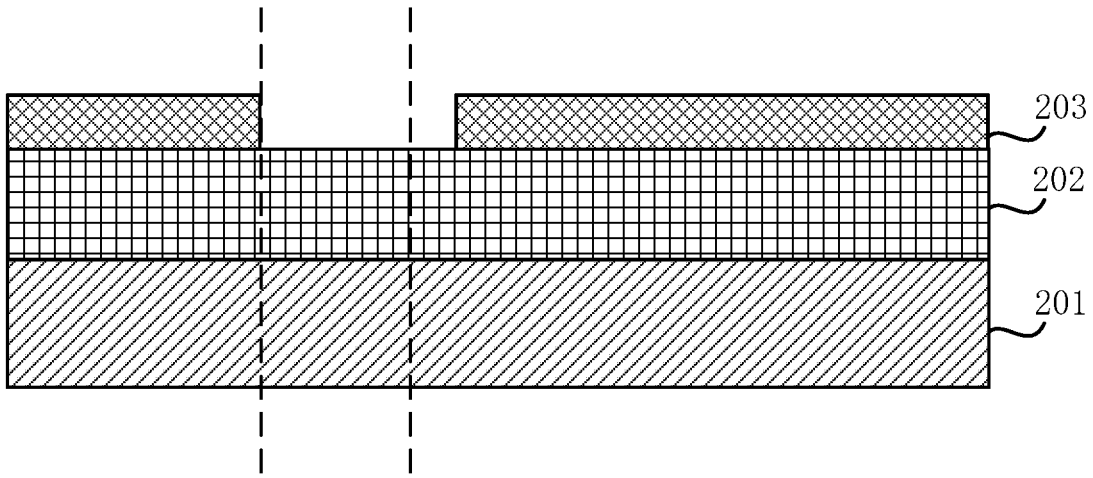

In addition, it is further noted that in the some embodiments as shown in FIGS. 14-16, unlike the patterned first mask layer 210 in FIGS. 4-6, the through hole 209 formed after patterning of the second mask layer 208 does not expose all the periphery regions 101 to the outside, but only exposes the position of the contact window 205 and a surrounding region of the position of the contact window 205. In practice, an area exposed after patterning of the second mask layer 208 may also expose the entire periphery region 101 as shown in FIGS. 4-6, so as to form a step-shaped second mask layer 208.

In some embodiments, the following steps are further included. The metal layer 104 is etched so as to form a bit line structure, and the bit line structure has a part extending into and above the periphery region 101.

This is an operation after forming of the metal layer 104. In the operation, in a procedure of etching the metal layer 104 to form the bit line structure, a length of the bit line structure is prolonged, and the bit line structure extends into the periphery region 101 by a preset distance, so that an end, on a side close to the contact window 205, of the bit line structure also has the higher height, which is substantially consistent with the height of the upper surface of the metal layer 104 exposed by the contact window 205, thereby preventing poor contact between the contact window 205 and the bit line structure as well.

Please refer to FIGS. 10-13, in some embodiments, etching the metal layer 104 so as to form the bit line structure, includes the following steps. A patterned third mask layer 206 is formed above the metal layer 104, please refer to FIG. 10, the third mask layer 206 covers the device region 103, the jointing region 102 and a part of the periphery region 101. The third mask layer 206 is used as a mask to pattern the metal layer 104 so as to form the bit line structure, and one end of the third mask layer 206 covers the periphery region 101, please refer to FIG. 11. The third mask layer 206 is removed, please refer to FIG. 12. In the some embodiments as shown in FIGS. 10-13, a large depth-to-width ratio of trenches 207 formed after patterning of the third mask layer is further shown in the procedure of forming the bit line structure. In FIGS. 10-13, a ratio of a depth D of the trench 207 to a width W of the trench is the depth-to-width ratio of the trench 207. When the ratio is large, it is difficult to control the uniformity of the etching when the metal layer below the trench 207 is etched by the etching gas.

Figure 13:
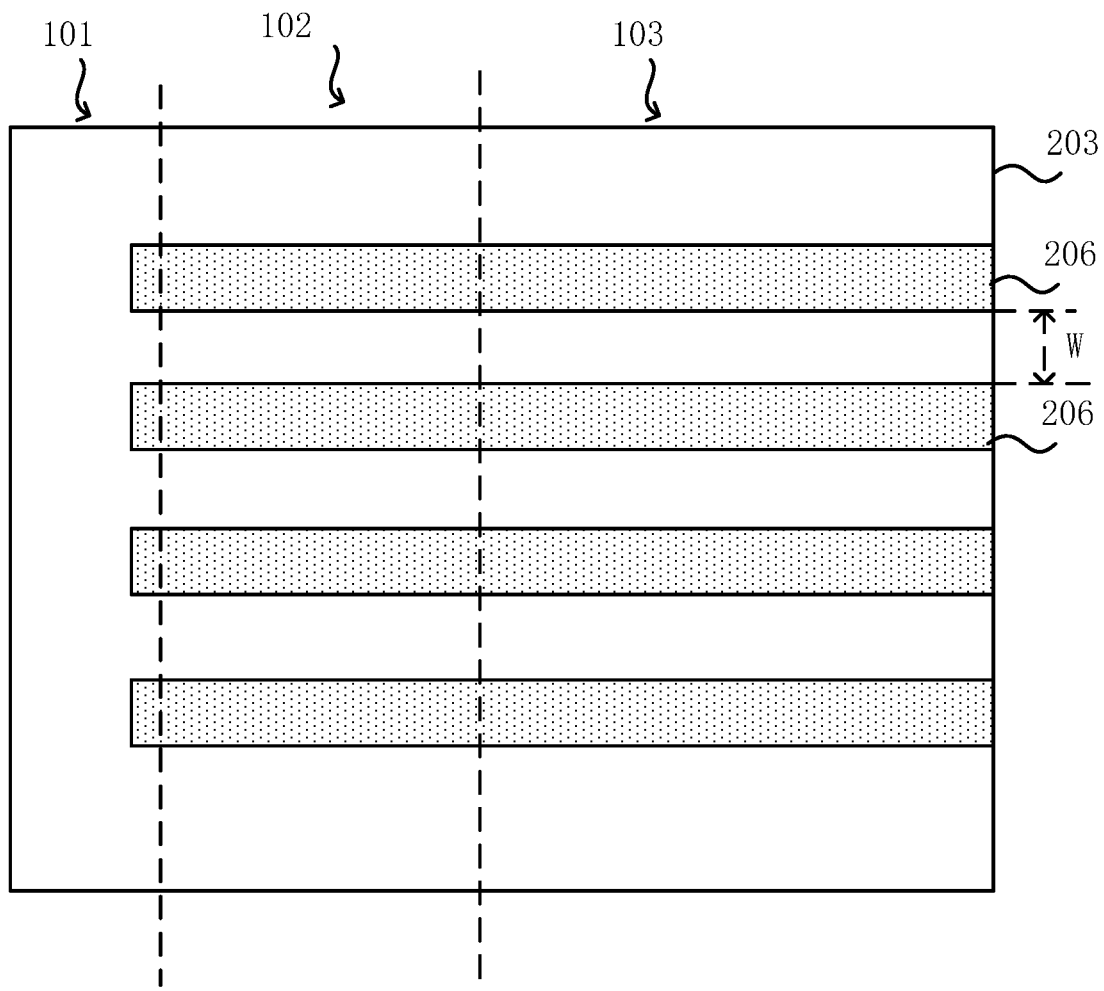

As can be seen from FIG. 13, the end of the third mask layer 206 extends into the periphery region 101, and the bit line structure formed on the basis of the third mask layer 206 as shown in FIG. 13 also extends into the periphery region 101.

The structure may be suitable for the situation that the upper surface of the metal layer 104 located in the region where the contact window 205 is located is lower than the upper surface of the metal layer 104 located in the device region 103, and also be suitable for the situation that the upper surface of the metal layer 104 located in the region where the contact window 205 is located is not lower than the upper surface of the metal layer 104 located in the device region 103.

In some embodiments, the metal layer 104 includes a conductive metal material layer such as a tungsten layer. When the preparation method is used to prepare the memory, a TiN layer and the like are further arranged between the polycrystalline silicon layer and the metal layer 104. The TiN layer and the like also fluctuate following at least one of the step-shaped polycrystalline silicon layer or nitride layer to form a step, so as to ensure that the metal layer 104 formed on the upper surface of the material layer such as the TiN layers has the step-shaped upper surface.

In the some embodiments, a semiconductor device is further provided and includes: a substrate 201, formed with a periphery region 101, a device region 103 and a jointing region 102; a metal layer 104 formed above the substrate 201; and a dielectric layer 204 formed above the metal layer 104. A contact window 205 is formed on a surface of the dielectric layer 204 so as to expose the metal layer 104, and a height of an upper surface of the metal layer 104 exposed to the contact window 205 is lower than a height of an upper surface of the metal layer 104 located in the device region 103.

In the some embodiments, the fact that the height of the upper surface of the metal layer 104 exposed to the contact window 205 is lower than the height of the upper surface of the metal layer 104 located in the device region 103 can effectively prevent etching gas from coming into contact with the upper surface of the metal layer 104 located in the contact window 205 region firstly when the metal layer 104 is etched, and avoid influencing on conductivity of a peripheral contact landing pad formed on the basis of the contact window 205.

In some embodiments, a first insulating layer 202 is further included. The first insulating layer is formed on an upper surface of the substrate 201 and located below the metal layer 104. Herein, a height of an upper surface of the first insulating layer 202 located below the periphery region 101 is lower than a height of an upper surface of the first insulating layer 202 located below the device region 103. In some embodiments, the first insulating layer 202 includes a nitride layer. In a procedure of preparing a memory, in order to be consistent with a preparation process of the memory, the first insulating layer 202 here refers to a silicon nitride layer located below the metal layer 104.

In some embodiments, a second insulating layer 203 is further included. The second insulating layer is formed on the upper surface of the substrate 201 and located below the metal layer 104. Herein, a height of an upper surface of the second insulating layer 203 located below the contact window 205 is lower than a height of an upper surface of the second insulating layer 203 located below the device region 103.

In the procedure of preparing the memory, in order to be consistent with the preparation process of the memory, the second insulating layer 203 here refers to a polycrystalline silicon layer located below the metal layer 104 and located above the silicon nitride layer.

On the basis that the nitride layer serves as the first insulating layer 202, the polycrystalline silicon layer is further formed on the upper surface of the nitride layer, which is consistent with the preparation process of the memory. Therefore, in addition to patterning the nitride layer so as to change the height of the surface to which the metal layer 104 is formed, the polycrystalline silicon layer may further be patterned so as to change the height of the surface to which the metal layer 104 is formed.

In the some embodiments, the polycrystalline silicon layer serving as the second insulating layer 203 is patterned, and the groove is formed in a preset region, so that when the metal layer 104 is formed on the upper surface of the polycrystalline silicon layer, the height of the upper surface of the metal layer 104 in the groove is lower than the height of the upper surface of the metal layer 104 located outside the groove. In this way, by presetting the position of the groove, it may be limited that the height of the upper surface of the metal layer 104 exposed to the contact window 205 is lower than the height of the upper surface of the metal layer 104 located in the device region 103, and the corresponding effect can be achieved.

In some embodiments, the semiconductor device includes a bit line structure, and the bit line structure is constituted by the metal layer 104 and has a part extending into and above the periphery region 101. This is an operation after forming of the metal layer 104. In the some embodiments, a length of the bit line structure is prolonged to extend into the periphery region 101 by a preset distance, so that an end, on one side close to the contact window 205, of the bit line structure also has the higher height, which is substantially consistent with the height of the upper surface of the metal layer 104 exposed by the contact window 205, thereby preventing poor contact between the contact window 205 and the bit line structure as well.

Although this disclosure has been disclosed as above through preferred embodiments, they are not intended to limit this disclosure. Any skilled in the art can make possible modifications and variations to the technical solution of this disclosure by utilizing the above disclosed methods and technical contents without departing from the spirit and scope of this disclosure. Thus, all the content not departing from the technical solution of this disclosure, any simple change, equivalent variations and modifications made to the above embodiments according to the technical essence of this disclosure all belong to the protection scope of the technical solution of this disclosure.

The invention claimed is:

1. A method for forming a semiconductor device, comprising:
   providing a substrate, wherein the substrate has a periphery region, a jointing region and a device region adjoined in sequence;
   forming a metal layer on an upper surface of the substrate;
   forming a dielectric layer above the metal layer; and
   forming an opening in the dielectric layer, wherein the opening is located above at least one of the periphery region or the jointing region so as to expose the metal layer to form a contact window, and a height of an upper surface of the metal layer exposed to the contact window is lower than a height of an upper surface of the metal layer located in the device region; wherein forming the metal layer comprises:
      forming a first insulating layer on the upper surface of the substrate;
      partially removing the first insulating layer to form a step-shaped first insulating layer, wherein a height of an upper surface of the first insulating layer located in the periphery region is lower than a height of an upper surface of the first insulating layer located in the device region; and
      forming the metal layer on the upper surface of the first insulating layer, wherein the metal layer is step-shaped and a height of an upper surface of the metal layer located in the periphery region is lower than the height of the upper surface of the metal layer located in the device region.

2. The method for forming the semiconductor device of claim 1, wherein partially removing the first insulating layer, comprises:
   forming a patterned first mask layer on the upper surface of the first insulating layer, wherein the periphery region and a part of the jointing region are exposed from the patterned first mask layer, and the patterned first mask layer covers the device region and a remaining portion of the jointing region;
   partially removing the first insulating layer using the patterned first mask layer as a mask; and
   removing the patterned first mask layer.

3. The method for forming the semiconductor device of claim 1, wherein the first insulating layer comprises a nitride layer.

4. The method for forming the semiconductor device of claim 1, further comprising:
   forming a second insulating layer on the upper surface of the substrate;
   partially removing the second insulating layer so as to form a groove at a position corresponding to the contact window, wherein a bottom surface of the groove is also located within the second insulating layer; and
   forming the metal layer on an upper surface of the second insulating layer, wherein a height of an upper surface of the metal layer formed in the groove is lower than the height of the upper surface of the metal layer located in the device region.

5. The method for forming the semiconductor device of claim 4, wherein partially removing the second insulating layer, comprises:

forming a patterned second mask layer on the upper surface of the second insulating layer, wherein a through hole is formed in the patterned second mask layer at a position corresponding to the contact window;

etching the second insulating layer downwards from the through hole in a direction perpendicular to the upper surface of the substrate so as to form the groove in a surface of the second insulating layer; and removing the patterned second mask layer.

6. The method for forming the semiconductor device of claim 1, further comprising:

etching the metal layer so as to form a bit line structure, wherein the bit line structure has a part extending into and above the periphery region.

7. The method for forming the semiconductor device of claim 6, wherein etching the metal layer so as to form the bit line structure, comprises:

forming a patterned third mask layer above the metal layer, wherein the patterned third mask layer covers the device region, the jointing region and a part of the periphery region;

using the patterned third mask layer as a mask to pattern the metal layer so as to form the bit line structure, wherein one end of the patterned third mask layer covers the periphery region; and removing the patterned third mask layer.

8. A semiconductor device, comprising:

a substrate, wherein the substrate has a periphery region, a jointing region and a device region adjoined in sequence;

a metal layer, formed above the substrate, wherein the metal layer is step-shaped and a height of an upper surface of the metal layer located in the periphery region is lower than a height of an upper surface of the metal layer located in the device region;

a dielectric layer, formed above the metal layer, wherein a contact window is formed in the dielectric layer to expose the metal layer, and a height of an upper surface of the metal layer exposed to the contact window is lower than the height of the upper surface of the metal layer located in the device region; and a step-shaped first insulating layer, located on an upper surface of the substrate and located below the metal layer, wherein a height of an upper surface of the step-shaped first insulating layer located in the periphery region is lower than a height of an upper surface of the step-shaped first insulating layer located in the device region.

9. The semiconductor device of claim 8, further comprising: a second insulating layer, formed on the upper surface of the substrate and located below the metal layer, wherein a height of an upper surface of the second insulating layer located below the contact window is lower than a height of an upper surface of the second insulating layer located below the device region.

10. The semiconductor device of claim 8, further comprising a bit line structure, wherein the bit line structure is constituted by the metal layer and has a part extending into and above the periphery region.

11. A method for forming a semiconductor device, comprising:

providing a substrate, wherein the substrate has a periphery region, a jointing region and a device region adjoined in sequence;

forming a second insulating layer on an upper surface of the substrate;

partially removing the second insulating layer so as to form a groove, wherein a bottom surface of the groove is located within the second insulating layer;

forming a metal layer on an upper surface of the second insulating layer, wherein a height of an upper surface of the metal layer formed in the groove is lower than a height of an upper surface of the metal layer located in the device region;

forming a dielectric layer above the metal layer; and forming an opening in the dielectric layer, wherein the opening is located above at least one of the periphery region or the jointing region so as to expose the metal layer to form a contact window at a position corresponding to the groove, and a height of an upper surface of the metal layer exposed to the contact window is lower than the height of the upper surface of the metal layer located in the device region.

12. The method for forming the semiconductor device of claim 11, wherein partially removing the second insulating layer, comprises:

forming a patterned second mask layer on the upper surface of the second insulating layer, wherein a through hole is formed in the patterned second mask layer at a position corresponding to the contact window;

etching the second insulating layer downwards from the through hole in a direction perpendicular to the upper surface of the substrate so as to form the groove in a surface of the second insulating layer; and removing the patterned second mask layer.

13. The method for forming the semiconductor device of claim 11, further comprising:

etching the metal layer so as to form a bit line structure, wherein the bit line structure has a part extending into and above the periphery region.

14. The method for forming the semiconductor device of claim 13, wherein etching the metal layer so as to form the bit line structure, comprises:

forming a patterned third mask layer above the metal layer, wherein the patterned third mask layer covers the device region, the jointing region and a part of the periphery region;

using the patterned third mask layer as a mask to pattern the metal layer so as to form the bit line structure, wherein one end of the patterned third mask layer covers the periphery region; and removing the patterned third mask layer.

* * * * *